(12) United States Patent
Smith et al.

(10) Patent No.: US 6,597,576 B1
(45) Date of Patent: Jul. 22, 2003

(54) MOUNTING ARRANGEMENTS FOR DATA COMMUNICATION DEVICES

(75) Inventors: Mark C. Smith, Huntsville, AL (US); Scott L. Carden, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 09/549,914

(22) Filed: Apr. 14, 2000

(51) Int. Cl.⁷ .................................................. G06F 1/16
(52) U.S. Cl. ..................... 361/724; 361/825; 312/223.2; 312/9.48
(58) Field of Search ........................ 361/683, 724–727, 361/825; 220/3.92, 3.94, 4.02; 312/223.1, 223.2, 111, 9.48, 242; 174/50

(56) References Cited

U.S. PATENT DOCUMENTS

| | | | | |
|---|---|---|---|---|
| 4,275,943 A | * | 6/1981 | Gelardi et al. .............. | 312/319 |
| 4,478,464 A | * | 10/1984 | Williams ....................... | 312/9 |
| 5,971,507 A | * | 10/1999 | Peroni ...................... | 312/223.2 |
| 6,462,961 B1 | * | 10/2002 | Johnson et al. ............. | 361/825 |

* cited by examiner

Primary Examiner—Darren Schuberg
Assistant Examiner—Lisa Lea-Edmonds
(74) Attorney, Agent, or Firm—Waddey & Patterson; Lucian Wayne Beavers (57) ABSTRACT

A mounting system is provided whereby a data communications system can be mounted in a plurality of different ways in one or more standard size rack openings and on planar surfaces. A first bracket selection and arrangement provides side by side dual mounting of two closures within a first rack having a first rack width. A second bracket selection and arrangement provides side by side dual mounting of two enclosures within a second rack having a second rack width greater than the first rack width. A third bracket selection and arrangement provides a single mounting of one enclosure in the first rack. A fourth bracket selection and arrangement provides a single mounting of one enclosure in the second rack. A fifth bracket selection and arrangement provides a single mounting of one enclosure on a planar surface.

6 Claims, 8 Drawing Sheets

FIG. 16

MOUNTING ARRANGEMENTS FOR DATA COMMUNICATION DEVICES

BACKGROUND OF THE INVENTION

1. Field of the Invention

The present invention relates generally to mounting arrangements for electronic equipment to be mounted in a rack mounting system and more particularly, to such systems suitable for mounting data communication devices.

2. Description of the Prior Art

Communication devices are typically constructed so as to be mounted in standard size racks. Each rack includes first and second vertical supports which are spaced by a standard opening width. For example, the racks commonly used by the telephone companies have a width of 23 inches, whereas the racks typically used by end users of telephone services have a rack opening of 19 inches.

Various communication equipment is typically constructed so as to fit between and be mounted within one of the standard size racks.

Additionally, the prior art includes various shelves constructed to fit within a standard rack, wherein the shelf has various slots defined therein for receiving equipment.

Also, it is commonly known to mount an item of electrical communication equipment on a vertical surface, such as a vertical wall of the phone terminal room of an end user.

It would be desirable to have a mounting system for data communication devices that would provide improved flexibility and allow the equipment to be mounted in multiple modes in each of the environments mentioned above

SUMMARY OF THE INVENTION

The present invention, in a first embodiment, provides a data communication system constructed to be mounted in a rack having a rack width defined between first and second supports. The system includes first and second equipment boxes, each box having a box width less than one-half of the rack width. The first and second boxes are structurally connected together to form a two box structure having a combined width less than the rack width. First and second mounting brackets are connected to the first and second boxes, respectively, for attaching the two box structure to the first and second supports of the rack.

The mounting brackets have two alternative mounting positions which allow the two box structure to be selectively mounted in either of the two alternative rack widths.

Additionally, either one of the boxes may be mounted on a vertical surface such as a wall utilizing the two mounting brackets.

Further flexibility is provided by the alternative use of a second set of mounting brackets which allows a single one of the boxes to be mounted within a standard rack.

In another embodiment, the invention includes a data communication apparatus which includes a battery box having a hinged front door. A chassis is mounted on the door of the battery box. The chassis has a face oriented transversely to the door. The face includes an opening for receiving a plurality of data communication cards therein. Access to the data communication cards can be achieved when the battery box is mounted on a wall in close proximity to other devices, by pivoting the door to swing the chassis away from the other devices.

In another embodiment of the invention, an enclosure for data communication equipment is provided which includes a six sided rectangular box. Two oppositely facing sides of the box include a plurality of mounting holes, which plurality of mounting holes includes a first pattern for mounting the box on a planar surface, a second pattern for mounting the box in a rack, and a third pattern for mounting a power supply on the box.

In yet another embodiment of the invention, a system is provided for mounting one or more electrical equipment enclosures in a plurality of alternative arrangements. The system includes at least one electrical equipment enclosure and a plurality of alternative mounting brackets which provide numerous alternative arrangements. A first bracket selection and arrangement provide side by side dual mounting of two enclosures within a first rack having a first rack width. A second bracket selection and arrangement provides side by side dual mounting of two enclosures within a second rack having a second rack width greater than the first rack width. A third bracket selection and arrangement provides a single mounting of one enclosure in the first rack. A fourth bracket selection and arrangement provides a single mounting of one enclosure in the second rack. A fifth bracket selection and arrangement provides a single mounting of one enclosure on a planar surface.

In another embodiment of the invention, a lockable communications device enclosure is provided, which includes an enclosure having a face with one or more openings defined therein for receiving a plurality of communication cards therein. The face has a first engagement surface defined thereon. A retaining structure retains the communication cards within the enclosure. The retaining structure extends across the one or more openings and includes a second engagement surface defined thereon complementary to the first engagement surface so that the first and second engagement surfaces can interlock. A tool actuated fastener detachably connects the retaining structure to the enclosure with the first and second engagement surfaces in interlocked position.

It is therefore, an object of the present invention to provide improved alternative mounting arrangements for data communication devices.

Another object of the present invention is the provision of a mounting system wherein first and second boxes, structurally connected together to form a two box structure, can be mounted within a standard rack.

And another object of the present invention is the provision of a system wherein such a two box structure has two alternative mounting positions in either of two alternative standard rack widths.

And another object of the present invention is the provision of a data communication apparatus including a chassis mounted on a hinged front door of a battery box, whereby access to devices contained in the chassis can be achieved by pivoting the door to swing the chassis away from other devices mounted adjacent the battery box.

And another object of the present invention is the provision of a lockable communications device enclosure apparatus including improved means for retaining data communication devices within an enclosure.

Other and further objects, features and advantages of the present invention will be readily apparent to those skilled in the art upon a reading of the following disclosure when taken in conjunction with the accompanying drawings.

DETAILED DESCRIPTION OF THE PREFERRED EMBODIMENTS

Figure 1:
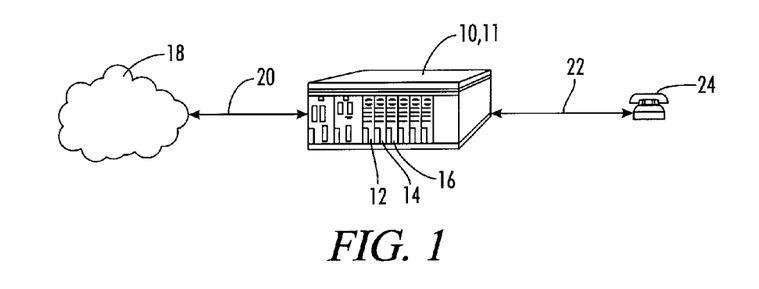
FIG. 1 is a schematic illustration of a single box data communications system connected between a network and end user devices, such as telephones.

FIG. 1 illustrates in schematic form a data communications system 10 having a single box enclosure 11 for data communication equipment, such as data communication cards 12, 14, 16 and the like.

The data communication system 10 is typically connected to public communications network 18 by communications line 20 which may, for example, be a standard T1 line. The data communication system 10 will in turn be connected by a plurality of telephone lines 22 to individual telephones 24 at the user's facility. It will be understood that the data communication system 10 might also be connected to other devices at the user's facility.

Figure 2:
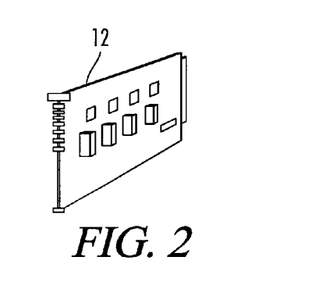
FIG. 2 is a perspective view of a single data communication card which could be received within the single box structure like that of FIG. 1.

One of the communication cards, such as card 12 is shown in perspective view in FIG. 2.

The present invention deals primarily with the construction of the enclosure 11 in combination with various arrangements of mounting brackets which allow one or two of the enclosures 11 to be mounted in a plurality of ways.

Figure 10:
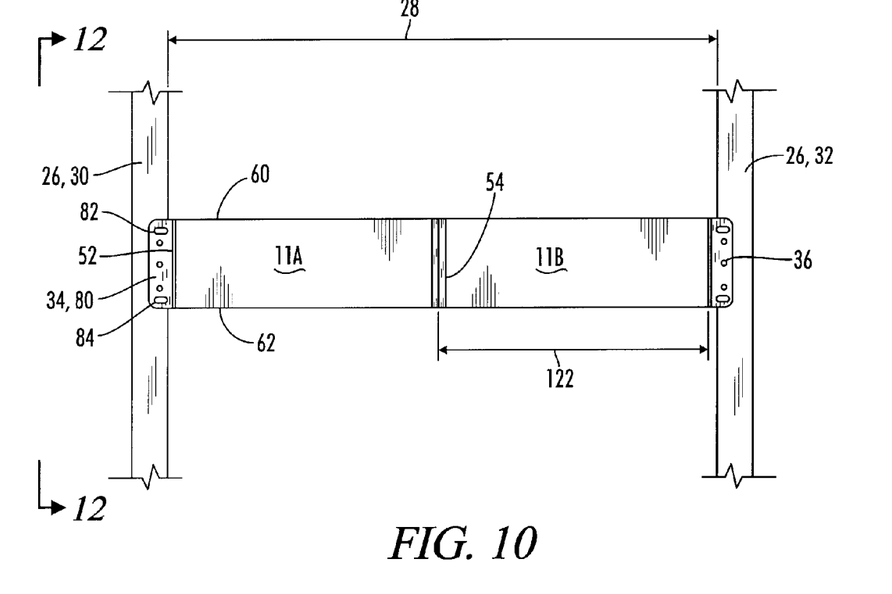
FIG. 10 is a front elevation view of a two box structure mounted within the standard 19 inch wide rack.

For example, FIG. 10 shows side by side mounting two enclosures, which have been designated as 11A and 11B, within a rack 26 having a rack width 28. The rack 26 is constructed of two vertical members 30 and 32. The rack 26 illustrated in FIG. 10 may, for example, be a standard communications device rack having a width 28 of 19 inches, such as is commonly utilized by end users of communications equipment. The enclosures 11A and 11B are mounted within the rack 26 by first and second brackets 34 and 36 which are further described below with regard to FIGS. 4–6.

Figure 11:
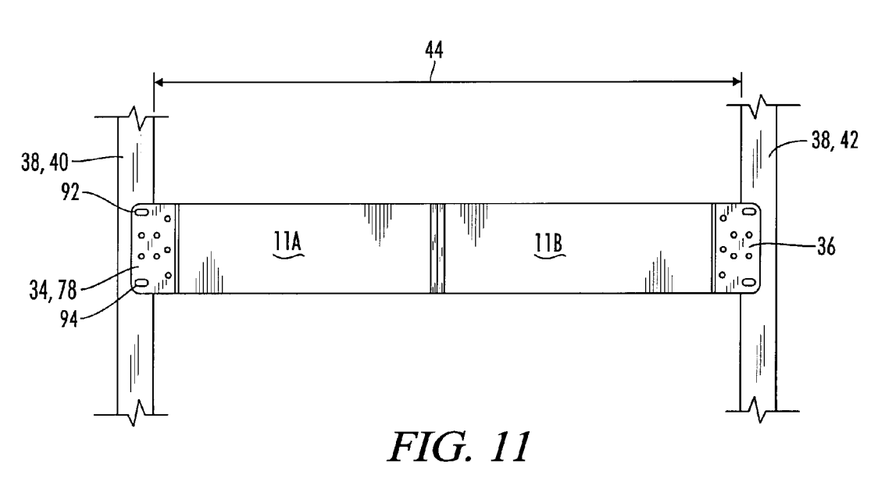
FIG. 11 is a front elevation view of a two box structure mounted within a standard 23 inch width rack.
Figure 12:
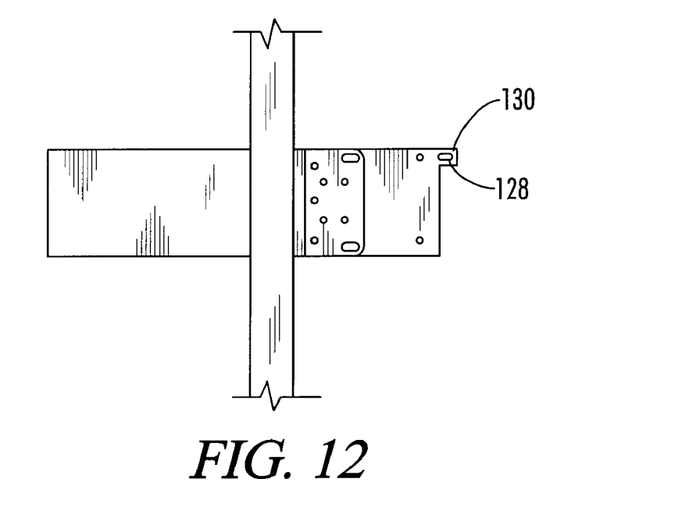
FIG. 12 is a side elevation view taken along line 12—12 of FIG. 10.

FIG. 11 illustrates a second mounting arrangement for the two enclosures 11A and 11B between vertical members 40 and 42 of a rack 38 having a rack width 44 which is greater than the rack width 28. Rack 38 may for example be a standard 23 inch wide rack such as is conventionally used by telephone companies. As will be further described below, the same two brackets 34 and 36 are utilized in FIG. 11, but in a different orientation than they were utilized in FIG. 10.

Figure 13:
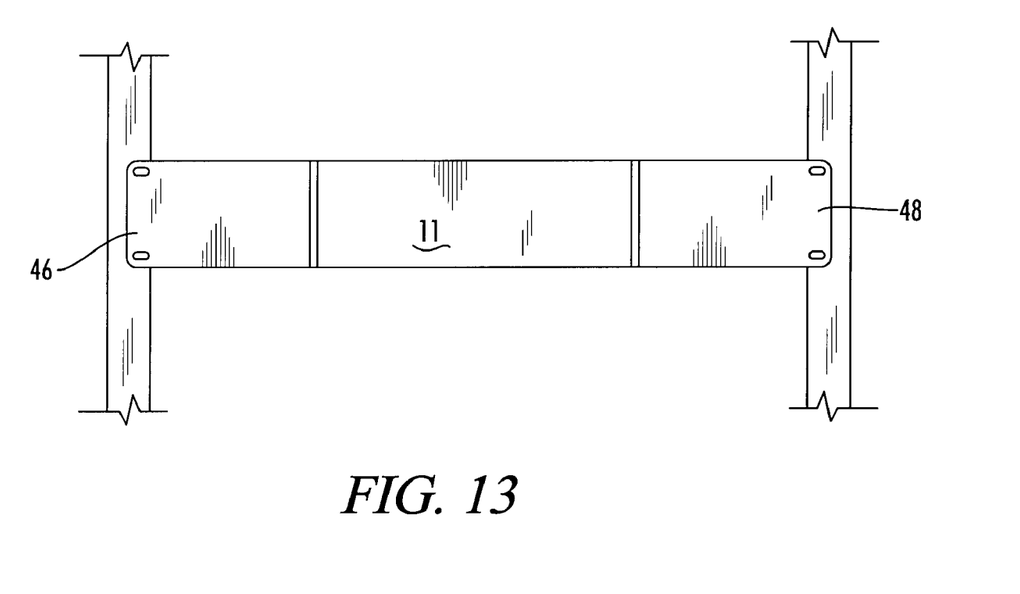
FIG. 13 is a front elevation view of a single box structure mounted within a standard rack of either dimension.

In still another possible mounting arrangement for one of the enclosures 11, as shown in FIG. 13, the same may be mounted within either of the racks 26 or 38 in a single enclosure arrangement utilizing a different set of brackets 46 and 48 which are further described below with regard to FIGS. 7–9. By choice of the dimensions of brackets 46 and 48, a single box mounting arrangement may be utilized in either the narrower rack 26 or the wider rack 38 of FIGS. 10 and 11, respectively.

Figure 14:
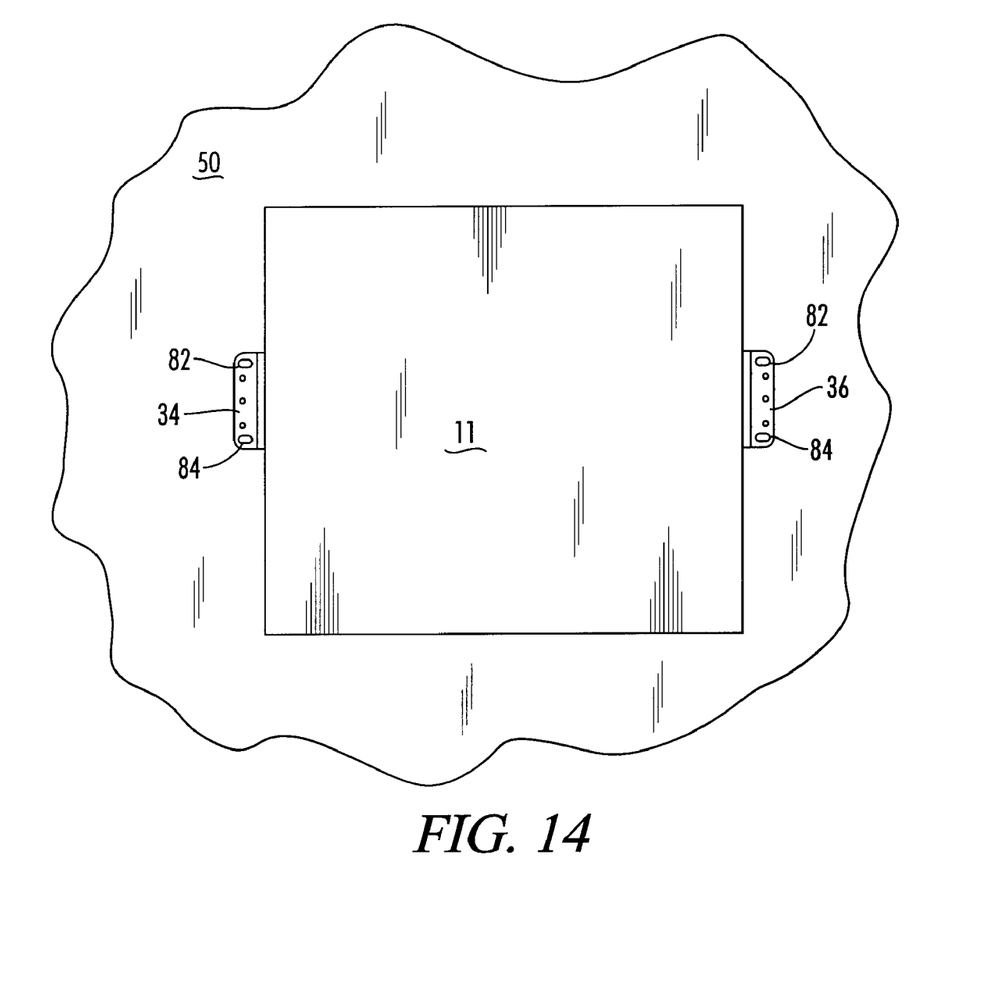
FIG. 14 is an elevation view of a single box structure mounted on a vertical surface such as a wall.

Finally, FIG. 14 illustrates still another mounting arrangement for a single one of the enclosures 11 wherein the same is mounted on a vertical surface, such as wall 50, by use of the first and second brackets 34 and 36.

Figure 3:
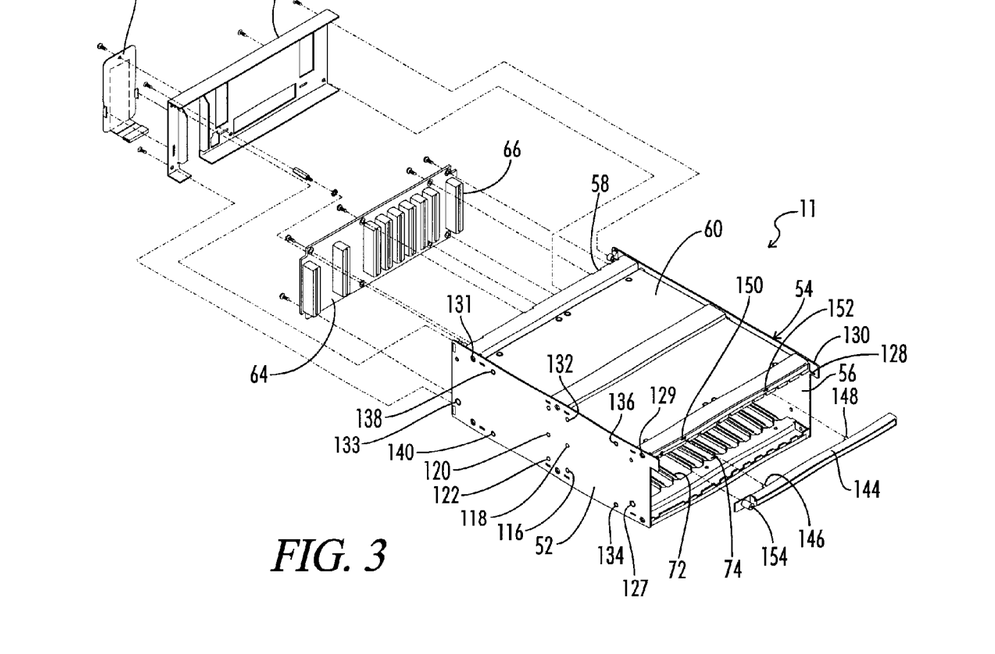
FIG. 3 is an exploded perspective view of the single box structure of FIG. 1.

The details of construction of one of the enclosure boxes 11 is shown in the exploded view of FIG. 3. The enclosure 11 can be described as a six sided rectangular box, two oppositely facing sides 52 and 54 of which include a plurality of mounting holes as best seen on side 52 in FIG. 3. As will be further described below, those mounting holes are arranged in a plurality of patterns to provide for alternative mounting of the enclosure on various support structures. The first and second sides 52 and 54 may be referred to as the left and right lateral sides when the enclosure 11 is mounted in a horizontal manner as shown in FIG. 10. The enclosure box 11 further includes a front side 56, a rear side 58, a top side 60 and a bottom side 62.

The rear side 58 receives a backplane board 64 having slots such as 66 for receiving the plug-in connectors of the communications card such as 12 in a conventional manner. The rear side 58 is closed by a rear cover 68 and an access panel 70.

The front side 56, which may also be referred to as a face 56, is generally open to and defines a plurality of opening slots, such as 72 and 74, for receiving data communication cards such as 12, 14, 16 and the like therein.

Figure 4:
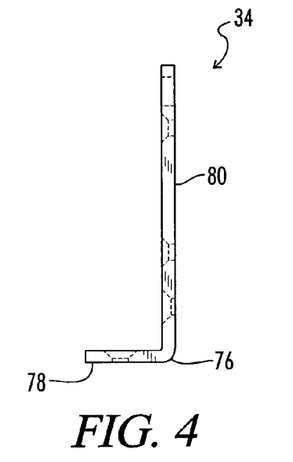
FIG. 4 is a plan view of a first mounting bracket having a shorter leg and a longer leg.
Figure 5:
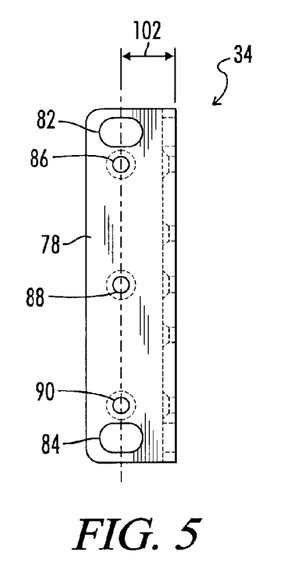
FIG. 5 is an elevation view of the shorter leg of the bracket of FIG. 4.
Figure 6:
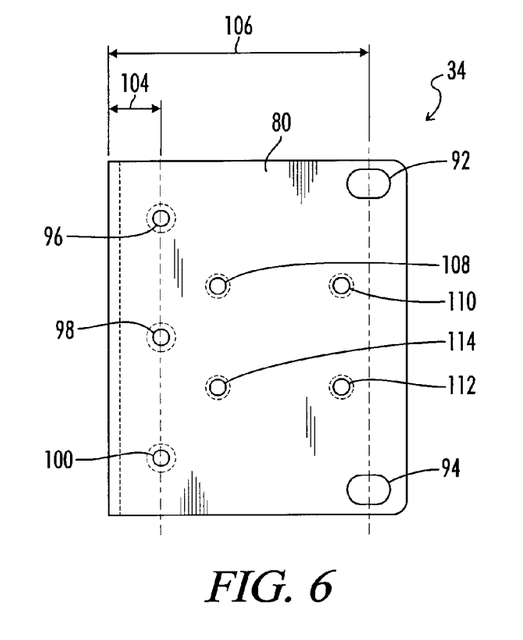
FIG. 6 is an elevation view of the longer leg of the bracket of FIG. 4.

Referring now to FIGS. 4, 5 and 6, the details of construction of mounting bracket 34 are shown. The mounting bracket 36 is identical.

As shown in the plan view of FIG. 4, the bracket 34 is constructed in a right angle shape having an apex 76 and having a shorter leg 78 and a longer leg 80.

As seen in FIG. 5, the shorter leg 78 has two oval shaped bolt holes 82 and 84 defined therein which can be described as a rack bolt pattern 82, 84. As can be seen, for example, in FIG. 10, the short leg 78 engages the vertical member 30 of rack 26 and the bracket 34 is attached to the rack 26 by bolts (not shown) extending through the oval shaped bolt holes 82 and 84.

The short leg 78 also includes three smaller bolt holes 86, 88 and 90 which can be described as a box bolt pattern 86, 88, and 90 which will be utilized to bolt the short leg 78 to the box 11 when the bracket 34 is reoriented in the manner shown in FIG. 11.

Similarly, the longer leg 80 shown in FIG. 6 includes a rack bolt pattern made up of oval bolt holes 92 and 94 which are utilized to bolt the bracket 34 to the vertical member 40 of rack 38 when in the orientation shown in FIG. 11. The longer leg 80 also includes a box bolt pattern made up of three smaller bolt holes 96, 98 and 100 which are utilized to bolt the longer leg 80 to the box structure 11 when the bracket 34 is in the orientation shown in FIG. 10.

As can be seen in FIGS. 5 and 6, each of the box bolt patterns made up of three smaller bolt holes are spaced identical distances 102 and 104 from the apex 76. As is also apparent in comparing FIGS. 5 and 6, the rack bolt patterns of the shorter and longer legs 78 and 80 are spaced different distances 102 and 106 from the apex 76. The different between distances 102 and 106 is equal to one-half of the difference between the two alternative rack widths 28 and 44. Thus, if the rack widths are 19 and 23 inches, as would be the case for two commonly used standard racks as previously described, then the difference between distance 102 and 106 would be two inches.

Furthermore, as seen in FIG. 6, the longer leg 80 includes four additional bolt holes 108, 110, 112 and 114 which can be described as an alternative box bolt pattern 108, 110, 112, 114 for allowing one of the boxes 11 to be mounted on a planar surface such as wall 50 with the first and second mounting brackets 34 and 36. The use of this alternative box bolt pattern can be better understood with reference to FIG. 3, and an examination of the various bolt holes found in the left side wall 52 of box 11.

Each of the left and right side walls 52 and 54 of box 11 can be described as including a plurality of mounting holes, which plurality of mounting holes includes a first pattern made up of mounting holes 116, 118, 120 and 122 for mounting the box 11 on a planar surface, such as wall 50.

The plurality of mounting holes of the left side 52 further includes a second pattern made up of mounting holes 116, 118 and 132 for mounting the box 11 in one of the racks of FIG. 10 or 11.

The left side wall 52 further includes a third pattern of mounting holes including holes 134, 136, 138 and 140 for mounting a power supply 142 (see FIG. 15) on the box 11.

The long leg 80 of bracket 34 can be mounted on left side wall 52 with the short leg 78 oriented flush with the bottom wall 62 and with the bolt holes 108, 110, 112 and 114 aligned with corresponding bolt holes 116, 118, 120 and 122. The bracket 34 will of course, be attached to the side wall 52 by bolts or machine screws fitted through the bolt hole patterns just described. With brackets 34 and 36 mounted on either side wall 52 and 54 of the box 11 in the manner just described, the box 11 can then be mounted on a planar surface, such as vertical wall 50 in a manner shown in FIG. 14, wherein wall bolts would extend through the oval holes 82 and 84 of brackets 34 and 36.

Referring again to FIG. 10, the structure illustrated therein can be described as a data communication system constructed to be mounted in the rack 26 having the width 28 defined between the first and second supports 30 and 32. The data communications system includes first and second equipment boxes 11A and 11B. Each box has a box width, such as 122 less than one-half of the rack width 28. The first and second boxes 11A and 11B are structurally connected together by a pluarality of screws (not shown), which extend through aligned threaded holes such as 127, 129, 131 and 133 seen in FIG. 3. The screws are inserted from inside one enclosure 11A and threaded through the holes into the corresponding holes of the adjacent enclosure 11B. Thus, the first and second boxes 11A and 11B are structurally connected together to form a two box structure having a combined width less than the rack width 28. The first and second mounting brackets 34 and 36 are then connected to the first and second boxes 11A and 11B, respectively, for attaching the two box structure to the first and second supports 30 and 32 of the rack 26.

As is apparent in viewing both FIGS. 10 and 11, the mounting brackets 34 and 36 have two alternative mounting positions which allow the two box structure 11A, 11B to be selectively mounted in either of the two alternative racks 26 or 38 having rack widths 28 or 44, respectively.

Figure 7:
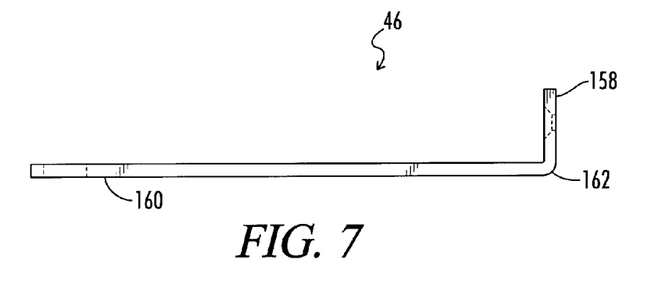
FIG. 7 is a plan view of alternative mounting bracket utilized to mount a single box within a standard rack mount system.
Figure 8:
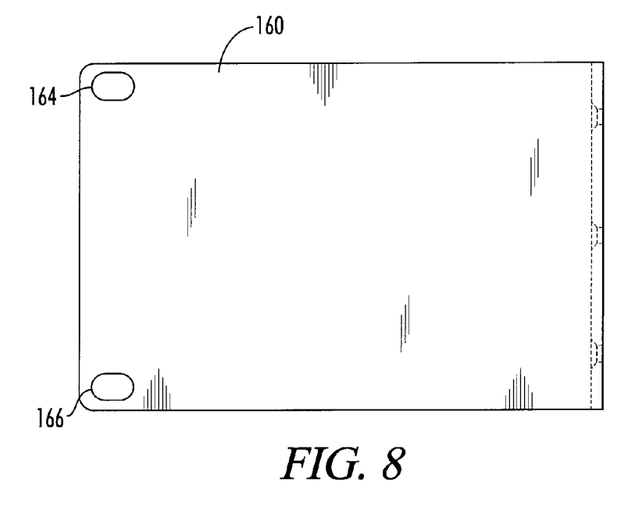
FIG. 8 is an elevation view of the longer leg of the bracket of FIG. 7.
Figure 9:
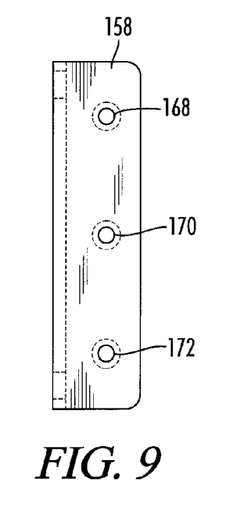
FIG. 9 is an elevation view of the shorter leg of the bracket of FIG. 7.

The mounting brackets 46 and 48 utilized to mount a single box structure within one of the standard rack arrangements are shown in greater detail in FIGS. 7–9. FIG. 7 is a plan view showing the mounting bracket 46 having a shorter leg 158 and a longer leg 160, which meet at an apex 162.

As seen in FIG. 8, the longer leg 160 includes a pair of oval shaped holes 164 and 166 for attachment to the vertical members of one of the mounting brackets. As seen in FIG. 9, the shorter leg 158 includes three smaller mounting holes 168, 170 and 172 for attachment to the box 11.

Figure 15:
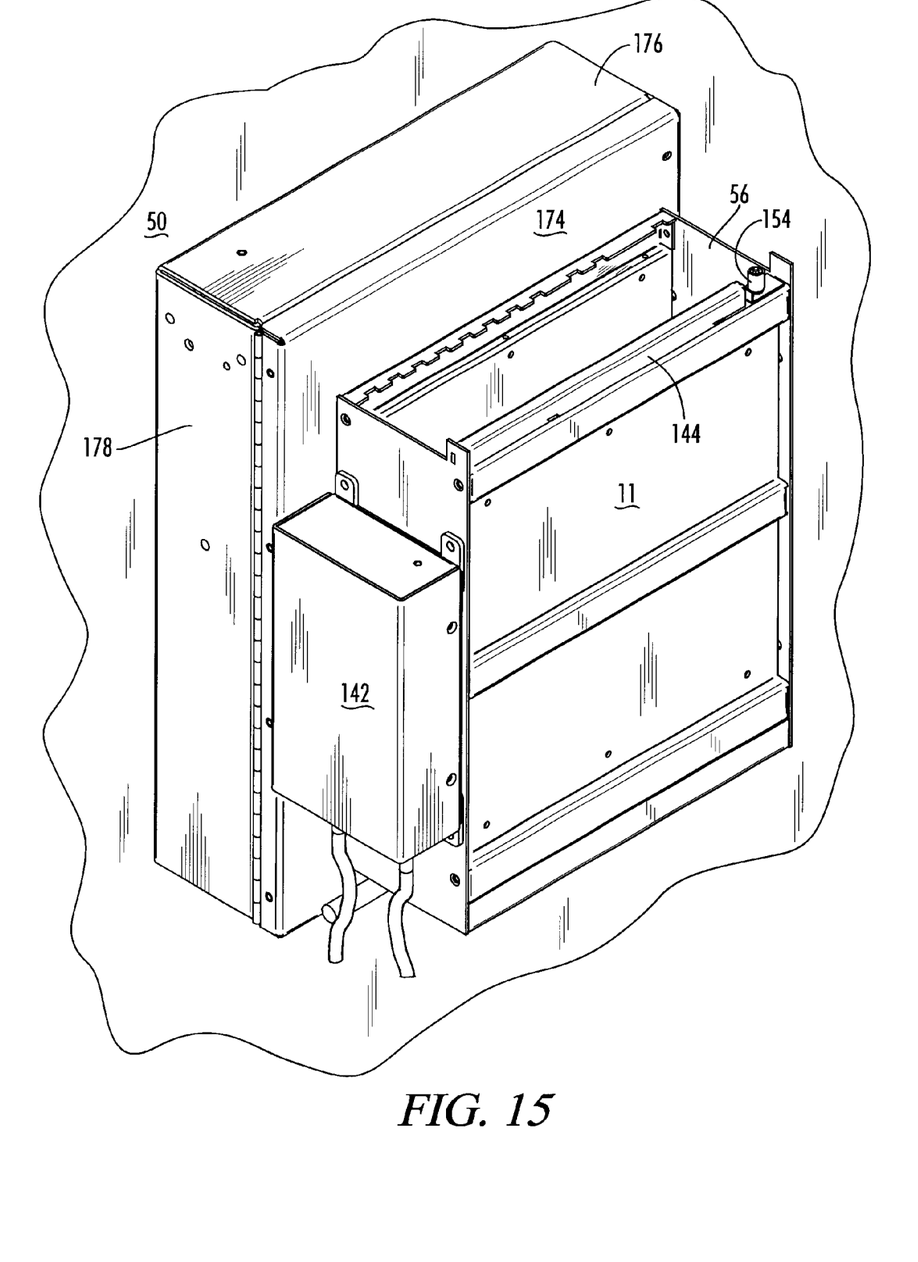
FIG. 15 is a perspective view of a single box structure mounted on a vertical hinged door of a battery box which is in turn mounted on a vertical wall.

Referring now to FIG. 15, another possible mounting arrangement for the box 11 is shown.

FIG. 15 illustrates a single box 11 mounted on a hinged front door 174 of a battery box 176 which is in turn mounted on a vertical surface, such as the wall 50.

It will be understood for example, that the communications device 11 shown in FIG. 15 might be mounted with the battery box 176 in order to provide battery backup in the event of a power failure on the local utility grid. The system shown in FIG. 15 includes the box 11, which might also be referred to as a chassis 11 mounted on the hinged front door 174 of the battery box 176. The chassis has a face, such as front face 56 previously described, which is oriented transversely to the door 174. Face 56 includes openings such as 72, 74 and the like defined therein for receiving a plurality of data communication devices, such as 12, 14 and the like therein as shown in FIG. 3.

The box 11 will be mounted on the door 174 in the same manner as described with reference to FIG. 14, utilizing the brackets 34 and 36 which cannot be seen in the view of FIG. 15.

Additionally, an external power supply and charger 142 is mounted on one side of the chassis 11 as seen in FIG. 15.

It will be understood that the system illustrated in FIG. 15 might be mounted on the wall 50 of a utility closet at the user's facility, and quite often there will be a great deal of other electrical equipment also mounted on the wall 50 in close proximity to the battery box 176.

With the system illustrated in FIG. 15, the front door 174 can be pivoted along vertical hinge 178 to move the battery box 11 away from the wall 50 to provide access to the devices 12 and 14 received therein. If the box 11 could not be so pivoted, it could be very difficult to remove and replace the devices 12 and 14 if another electrical apparatus were mounted on the wall 50 in close proximity to the open front 56 of box 11.

As previously noted, the front side 56 of box 11 has openings such as 72 and 74 defined therein for receiving a plurality of data communication devices, such as 12, 14, 16 and the like within the box 11. Those devices are not illustrated in FIG. 15, but are shown in FIG. 3.

Another new feature of the enclosure box 11 is the provision of means for retaining the data communication devices, such as 12, 14 and 16 within the box 11. This feature is provided by a retaining bracket 144 best seen in FIG. 16.

Figure 16:
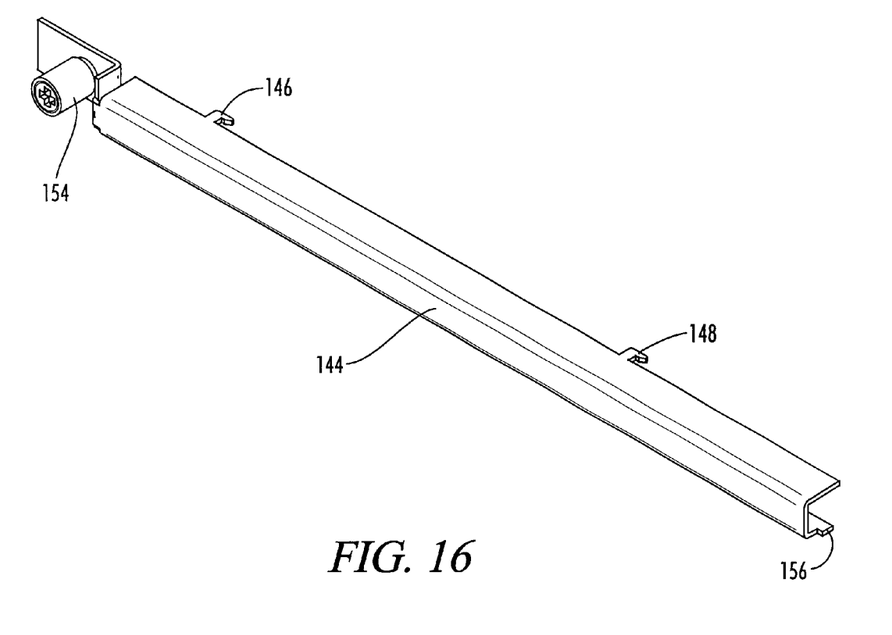
FIG. 16 is a perspective view of a locking bar.

The retaining bracket 144 includes two hooks 146 and 148 defined on its side, and a tab 156 on its right hand end.

The box 11 includes two holes 150 and 152 defined therein, and includes an ear 130 with a slot 128 therein. The holes 150 and 152 and hooks 146 and 148 are complementary shaped. Also the tab 156 fits in slot 128. After the communication devices 12, 14, 16 and the like are placed within the open front 56 of the box 11, the retaining bracket 144 can be placed across the front of the communication devices, and the hooks 146 and 148 engaged with the slots or openings 150 and 152 in the box 11, and the tab 156 received in slot 128. The retaining bracket 144 is then detachably connected to the box 11 by fastener 154 which may be a threaded lock screw.

The slots 150 and 152 defined in box 11 may be described as engagement surfaces 150 and 152, and the hooks 146 and 148 defined on retaining bracket 144 may be described as second engagement surfaces which are complementary to the slots 150 and 152, so that the hooks and slots can interlock. The threaded fastener 154 in turn can retain the bracket 148 in place, with the hooks and slots in their interlocked positions.

Preferably, the threaded fastener 154 is constructed to be actuated or engaged with a tool, such as a screwdriver or an allen wrench, and can be described as a tool actuated fastener 154.

Thus, it is seen that the apparatus of the present invention readily achieves the ends and advantages mentioned as well as those inherent therein. While certain preferred embodiments of the invention have been illustrated and described for purposes of the present disclosure, numerous changes in the arrangement and construction of parts may be made by those skilled in the art, which changes are encompassed within the scope and spirit of the present invention as defined by the appended claims.

What is claimed is:

1. A data communication system constructed to be mounted in a rack having a rack width defined between first and second supports, the system comprising:

first and second equipment boxes, each box having a box width less than one-half of the rack width, the first and second boxes being structurally connected together to form a two box structure having a combined width less than the rack width; and first and second mounting brackets, connected to the first and second boxes respectively, for attaching the two box structure to the first and second supports of the rack, wherein the mounting brackets have two alternative mounting positions which allow the two box structure to be selectively mounted in either of two alternative rack widths.

2. The system of claim 1, wherein the two alternative rack widths are 19" and 23".

3. The system of claim 1, wherein:

each mounting bracket is constructed in a right angle shape having an apex and having a shorter leg and a longer leg;

the shorter leg and the longer leg each include a plurality of bolt holes defined therein including a box bolt pattern and a rack bolt pattern;

the box bolt patterns of each of the shorter and longer legs are spaced identical distances from the apex of the right angle shape; and the rack bolt patterns of each of the shorter and longer legs are spaced different distances from the apex of the right angle shape, the difference being equal to one-half of a difference between the two alternative rack widths.

4. The system of claim 3 wherein:

each of the longer legs further includes an alternative box bolt pattern for allowing one of the boxes to be mounted on a planar surface with the first and second mounting brackets.

5. The system of claim 1, wherein:

each mounting bracket is constructed in a right angle shape having an apex and having a shorter leg and a longer leg;

the shorter leg and the longer leg each include a plurality of bolt holes defined therein including a box bolt pattern and a rack bolt pattern;

the box bolt patterns of each of the shorter and longer legs are spaced identical distances from the apex of the right angle shape; and the rack bolt patterns of each of the shorter and longer legs are spaced different distances from the apex of the right angle shape.

6. The system of claim 1, wherein:

the first and second boxes are substantially identical; and the first and second mounting brackets are substantially identical.

\* \* \* \* \*